United States Patent [19]

Chhabra

[11] Patent Number: 5,135,391

[45] Date of Patent: Aug. 4, 1992

[54] SEMICONDUCTOR PROCESSING GAS DIFFUSER PLATE

[75] Inventor: Navjot Chhabra, Boise, Id.

[73] Assignee: Micron Technology, Inc., Boise, Id.

[21] Appl. No.: 513,554

[22] Filed: Apr. 24, 1990

[51] Int. Cl.$^5$ .......................... F27B 9/04; C23C 16/00
[52] U.S. Cl. .................................. 432/152; 432/253; 432/11
[58] Field of Search .................. 432/2, 5, 6, 11, 41, 432/47, 57, 65, 123, 126, 152, 153, 161, 185, 194, 226

[56] References Cited

U.S. PATENT DOCUMENTS

| | | | |
|---|---|---|---|
| 4,459,104 | 7/1984 | Wollmann | 432/123 |
| 4,911,638 | 3/1990 | Bayne et al. | 432/152 |
| 5,024,599 | 6/1991 | Chhabra | 432/253 |

Primary Examiner—Henry C. Yuen
Attorney, Agent, or Firm—Wells, St. John & Roberts

[57] ABSTRACT

Disclosed is a baffle apparatus for insertion into a semiconductor wafer processing furnace to diffuse processing gases that are injected into the furnace by an injector nozzle. The baffle apparatus comprises: a diffuser plate assembly having an upper end and a lower end, the diffuser plate assembly having at least one diffuser plate against which injected gases are to be forced; and the lower end of the diffuser plate assembly being sized and shaped to engage with and be supported by an elongated wafer paddle.

9 Claims, 2 Drawing Sheets

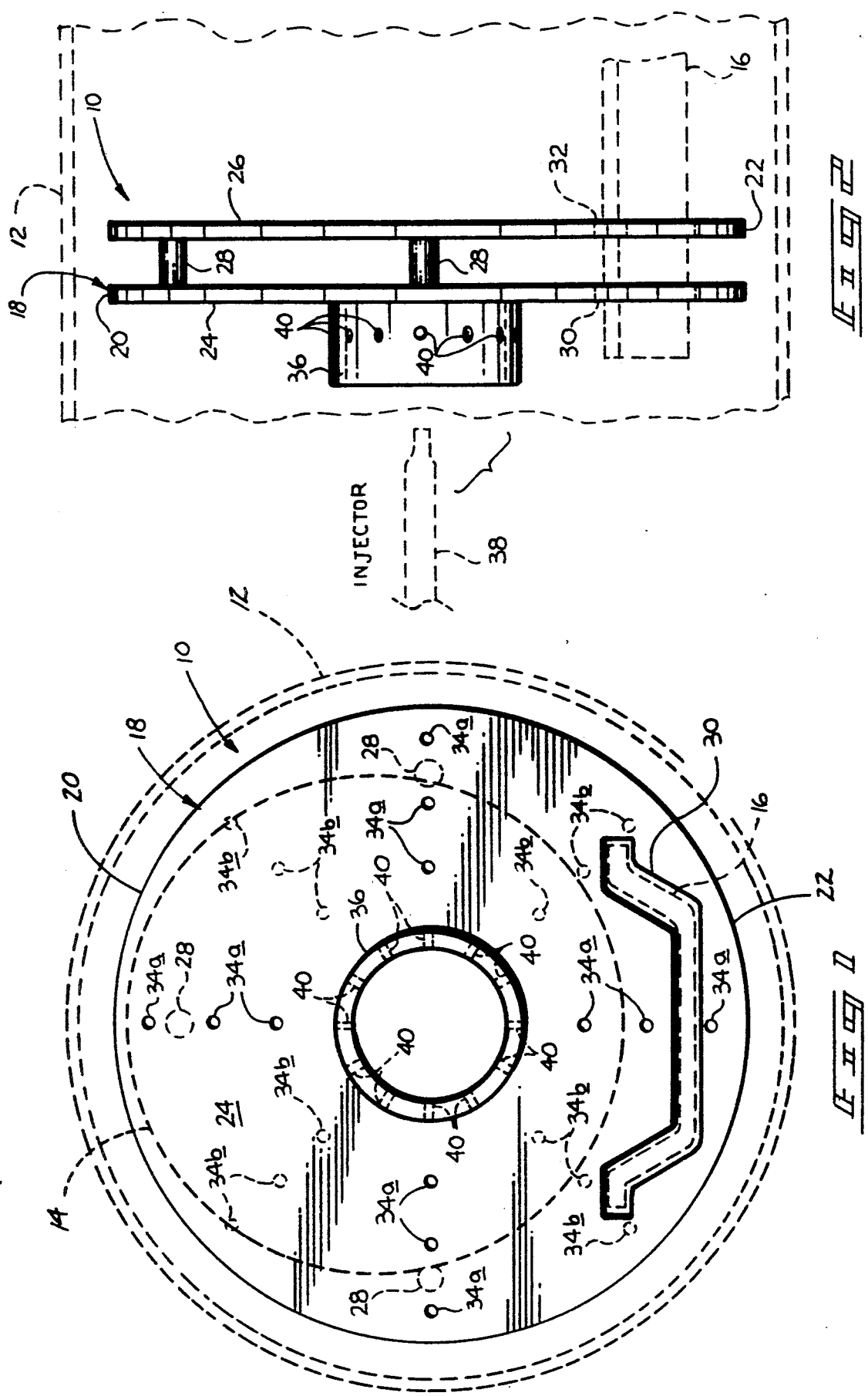

SEMICONDUCTOR PROCESSING GAS DIFFUSER PLATE

TECHNICAL FIELD

This invention relates generally to treatment of semiconductor wafers with processing gases within semiconductor processing furnaces.

BACKGROUND OF THE INVENTION

One type of semiconductor processing furnace is in the shape of an elongated hollow tube having electric coils wrapped therearound. Replaceable quartz tubes having diameters just slightly less than the internal diameter of the furnace are placed inside the furnaces. One end of the furnace and tube are provided with an opening for a gas injector system for injecting the processing gases into the tube within the furnace during treatment.

Semiconductor wafers are supported within the furnace for processing on an elongated silicon carbide wafer paddle which is defined by an elongated well having upwardly rising and outwardly flaring sides. The wafers are supported vertically on such paddle, typically on wafer cassettes, made of quartz which are mounted on the elongated wafer paddle. Gases are injected into one end of the furnace and flow outwardly through the furnace to treat the wafers, and are exhausted from the opposite furnace end.

One of the concerns associated with processing semiconductor wafers in such furnaces is to provide sufficient exposure of all of the closely stacked wafers to the injected gas. However, the configuration of the furnace in relation to the position of the stacked wafers tends to cause gas to stram down the side of the internal furnace walls, and not uniformly access in between the adjacently stacked wafers. One such method of facilitating injection of gases between the wafers is to provide a baffle in the quartz tube downstream of the injector nozzle to cause turbulence and diffusion. This minimizes the tendency of the gas to stream down the walls of the furnace tube.

This invention concerns improvements with such baffles and supporting such baffles within quartz tubes.

BRIEF DESCRIPTION OF THE DRAWINGS

The preferred embodiment of the invention is illustrated in the accompanying drawings, in which:

FIG. 1 is a front longitudinal end view of a first embodiment baffle apparatus, shown positioned within a quartz furnace tube, in accordance with the invention.

FIG. 2 is a side elevationsl view of the baffle apparatus of FIG. 1.

DETAILED DESCRIPTION OF THE PREFERRED EMBODIMENTS

Figure 4:
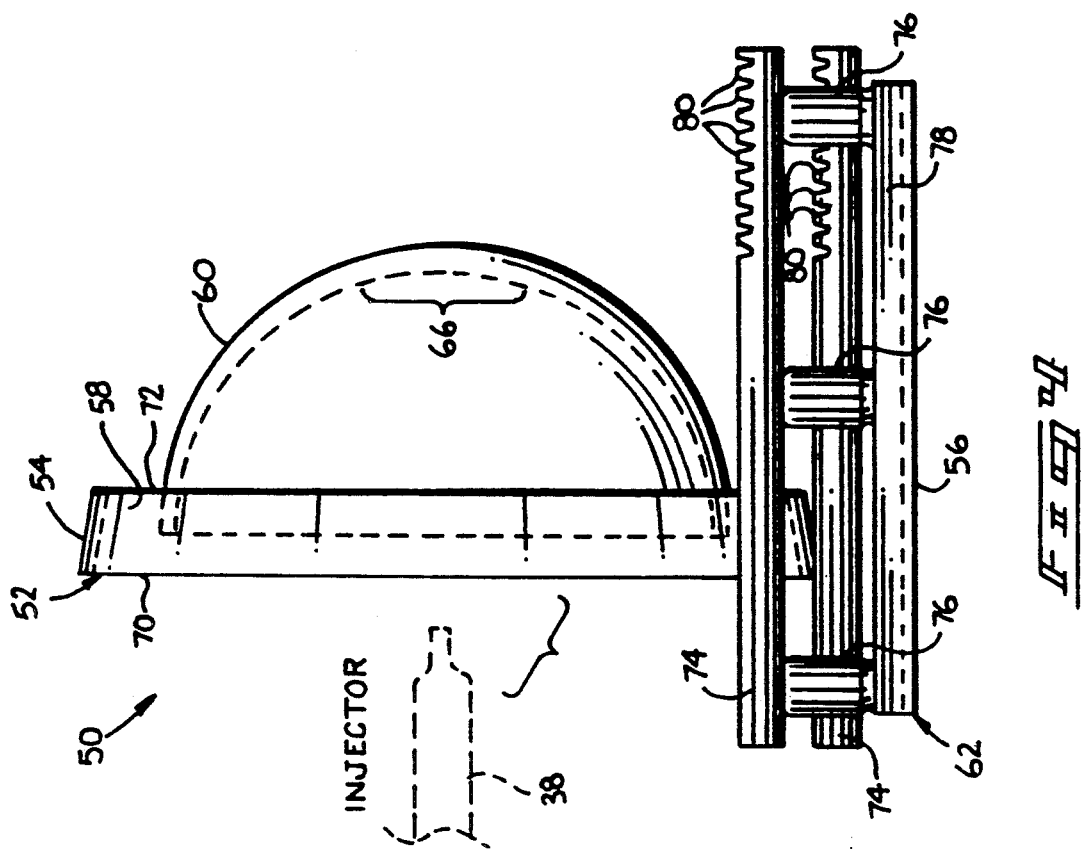
FIG. 4 is a side elevational view of the baffle apparatus of FIG. 3.

The following disclosure of the invention is submitted in furtherance with the constitutional purpose of the Patent Laws "to promote the progress of science and useful arts" (Article 1, Section 8).

Referring to FIGS. 1 and 2, a first embodiment baffle apparatus for insertion into a semiconductor wafer processing furnace to diffuse processing gases injected into the furnace by an injector nozzle, is indicated generally by reference numeral 10. Semiconductor wafers woul be supported within the processing furnace on an elongated wafer paddle for sliding wafers into and out of the furnace. The outline of a circular quartz furnace tube is indicated with numeral 12, while the outline of a semiconductor processing wafer is indicated with numeral 14 (FIG. 1). A wafer paddle is indicated with numeral 16, and is defined by an elongated wall having upwardly rising and outwardly flaring sides which, for the purposes of the description, define an upwardly open female shape. Paddle 16 in operation is suported in a cantilevered manner externally from one end of the furnace.

Baffle apparatus 10 is defined by a diffuser plate assembly 18 having an upper end 20 and a lower end 22. Diffuser plate assembly 18 has at least one diffuser plate against which injected gases are to be forced. In the illustrated embodiment, diffuser plate assembly 18 includes first and second circular quartz diffuser plates 24, 26 respectively. First and second plates 24, 26 are connected and longitudinally space relative to one another by a series of three quartz connecting rods 28. These rods are positioned relative to plates 24 and 26 at the nine, twelve, and three o'clock positions. The lower end of diffuser plate assembly 18 is sized and shaped to engage with and be supported by elongated wafer paddle 16.

More particularly, each of first and second plates 24, 26 includes a paddle opening 30, 32, respectively. Paddle openings 30, 32 are shaped to correspond to the cross sectional shape of wafer paddle 16. The size of paddle openings 30, 32 is slightly larger than the wafer cross sectional size and shape. Further, paddle openings 30, 32 are longitudinally aligned with one another. In this manner, the lower end 22 of diffuser plate assembly 18 is slidable over and along wafer paddle 16 by receipt of wafer paddle 16 through paddle openings 30, 32. Engagement of paddle 16 and paddle openings 30, 32 supports diffuser plate assembly 18 in an upright position relative to paddle 16.

First and second diffuser plates 24, 26 are perforated to facilitate gas mixing, diffusion and turbulence. Perforations 34a are included in first plate 24, while perforations 34b are included in second plate 26 (FIG. 1). Perforations 34a, 34b form repetitive patterns in each of first and second diffuser plates 24, 26 respectively, with the patterns of the two diffuser plates being rotationally offset from one another. In the illustrated embodiment, the patterns of first and second plates 24, 26 are the same, and are repetitive at 90° rotation intervals. Referring to first plate 24, perforations 34a are defined by a series of three radially spaced holes which are positioned 90° fron one another at the twelve, three, six, and nine o'clock positions. Perforations 34b of second diffuser plate 26 are as well positioned 90° from one another, but rotationally offset from performtions 34a of first diffuser plate 24 by a rotation angle of 45°.

First diffuser plate 24 includes a diffuser cup 36 which is positioned, thereon to longitudinally align with a furnace injector nozzle 38 (FIG. 2) when diffuser plate assembly 18 is received by elongated wafer paddle 16 within a semiconductor processing furnace. Cup 36 is in the form of a quartz cylindrical sleeve which is welded to the face of first plate 24. Cup 36 can be considered as a partial concavity introduced into the face of diffuser plate 24. In the illustrated embodiment, that area of first diffuser plate 24 within cup 36 is not perforated, while the perforations 34a are provided only in an area external to the position of diffuser cup 36. Diffuser cup 36 includes a series of radial holes 40 to facilitate flow of gas therefrom, as emitted by injector 38.

The following are example preferred dimensions for the various components for a quartz processing tube having an internal diameter of 211 mm. All components would be preferably made of quartz. Each of first and second diffuser plates 24, 26 would be 190 mm in diameter. Each would 3 mm thick. Supports 28 would be 25 mm long, and thereby longitudinally space first and second plates 24, 26 respectively 25 mm from one another. Perforation holes 34a, 34b and 40 would be 3.5 mm in diameter. Holes 40 would be positioned 15° apart. The quartz sleeve which forms cup 36 would be 25 mm in length, and have an internal diameter of 50 mm.

A second embodiment baffle apparatus 50 in accordance with the invention is described with reference to FIGS. 3 and 4. Baffle apparatus 50 is defined by a diffuser plate assembly 52 having upper and lower ends 54, 56 respectively. Diffuser plate assembly 52 is comprised of an outer ring-like portion 58, an internally supported diffuser plate 60, and a lower support 62 which extends from ring-like portion 58 and supports assembly 52 relative to an elongated wafer paddle.

Figure 3:
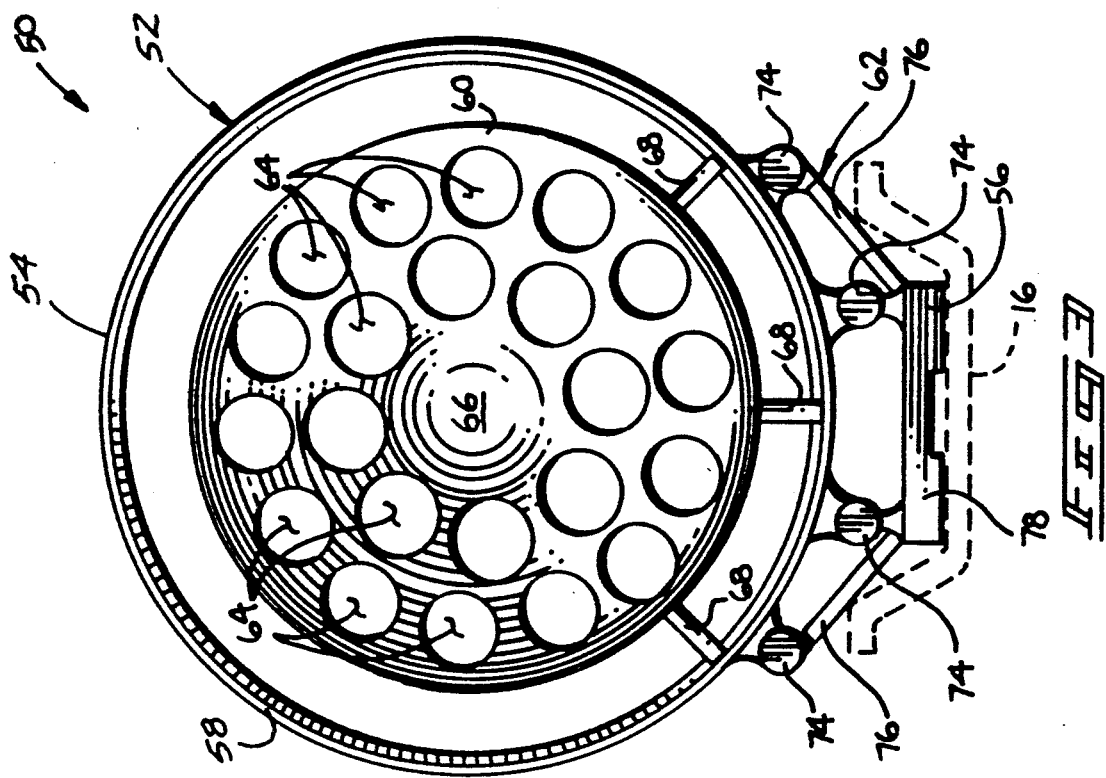
FIGS. 3 is a front longitudinal end view of a second embodiment baffle apparatus in accordance with the invention.

Referring first to diffuser plate 60, it is concave (half spherical) in the direction from which gases would be emitted by a furnace injector nozzle 38 (FIG. 4), and includes a series of perforations 64 (FIG.3). Perforations 64 are provided radially outward from a smaller central section of plate 60, to provide a perforated area, and a nonperforated area 66. Nonperforated area 66 is positioned to longitudinally align with injector 38 when diffuser plate assembly 52 is received by an elongated wafer paddle 16 within a semiconductor wafer processing furnace (FIG. 3). In this manner, diffuser plate 60 acts similar to a shower head for diffusing gases in a spray pattern for creating a turbulent mixing and flow of gases for engaging the wafers.

Ring-like portion 58 is circular. It inwardly and concentrically supports diffuser plate 60 relative thereto by a series of three lower supports 68. Ring-like portion 58 can be considered as having a fore longitudinal end 70 and an aft longitudinal end 72. Ring-like portion 50 has a varying diameter which tapers inwardly from fore longitudinal end 70 to aft longitudinal end 72. Ring-like portion 58 directs any additional gas flow inwardly and therefore away from the walls of the furnace tube, thereby further diminishing any tendency of the gases to streamline down the walls of the furnace and around the wafers.

Support assembly 62 at lower end 56 of diffuser plate assembly 52 is of a male fitting cross sectional size and shape which is complimentary to the upward female size and shape of elongated wafer paddle 16. Support assembly 62 is similar in shape to a standard quartz cassette which would be mounted to a silicon carbide wafer paddle for supporting wafers. The external male shape of support 62 will matingly fit within wafer paddle 16 to position the diffuser plate relative to a furnace injector nozzle when assembly 52 and paddle 16 are received within a semiconductor wafer processing furnace (FIG. 3).

More particularly, support 621 is longitudinally elongated with ring-like portion 58 and diffuser plate 60 being laterally oriented relative thereto. Support 62 is defined in part by five longitudinally elongated components. Four of these components 74 are elongated rods which are positioned relative to one another to form a cradle which supports ring-like portion 58. Three laterally oriented and longitudinally spaced pairs of supports 76 interconnect and support rods 74. The fifth longitudinally elongated component is a base 78 which connects with and supports the lower two of rods 74 for supporting assembly 52 relative to wafer paddle 16.

A series of laterally aligned slots 80 are provided in each of rods 74 aft of concave diffuser plate 60. These slots are sized and positioned to receive wafers or wafer dummies aft of diffuser plate 60 and downstream of a furnace injector nozzle from diffuser plate 62.

In compliance with the statute, the invention has been described in language more or less specific as to structural features. It is to be understood, however, that the invention is not limited to the specific features shown and described, since the means and construction herein disclosed comprise a preferred form of putting the invention into efect. The invention is, therefore, claimed in any of its forms or modifications within the proper scope of the appended claims appropriately interpreted in accordance with the doctrine of equivalents.

I claim:

1. A baffle apparatus for insertion into a semiconductor wafer processing furnace to diffuse processing gases that are injected into the furnace by an injector nozzle, the semiconductor wafers being supported within the furnace on an elongated wafer paddle for sliding wafers into and out of the furnace, the wafer paddle being defined by an elongated well having upwardly rising sides, the baffle apparatus comprising:

a diffuser plate assembly having an upper end and a lower end, the diffuser plate assembly having at least one diffuser plate against which injected gases are to be forced:

the lower end of the diffuser plate assembly being sized and shaped to engage with and be supported by an elongated wafer paddle, the lower end of the diffuser plate assembly including a paddle opening which is shaped to correspond to a cross sectional shape of a wafer paddle, the paddle opening being sized slightly larger than the wafer paddle cross sectional shape, the lower end of the diffuser plate assembly thereby being slidable over and along the wafer paddle by receipt of the wafer paddle through the paddle opening, with engagement of the paddle and paddle opening supporting the diffuser plate assembly in an upright position relative to the paddle; and a diffuser cup on the diffuser plate, the diffuser cup being positioned on the diffuser plate to longitudinally align with a furnace nozzle when the diffuser plate assembly is received by an elongated wafer paddle within a semiconductor wafer processing furnace.

2. The baffle apparatus of claim 1 wherein the diffuser cup includes radial holes.

3. The baffle apparatus of claim 1 wherein the diffuser plate is perforated in an area external of the position of the diffuser cup.

4. A baffle appartaus for insertion into a semicondcutor wafer processing furnace to diffuse processing gases that are injected into the furnace by an injector nozzle, the semiconductor wafers being supported within the furnace on an elongated wafer paddle for sliding wafers into and out of the furnace, the baffle apparatus comprising:

a diffuser plate assembly having an upper end and a lower end, the diffuser plate assembly having at least first and second diffuser plates against which injected gases are to be forced, the first and second diffuser plates being longitudinally spaced relative to one another;

the lower ends of the first and second diffuser plates each including a paddle opening which is shaped to correspond to a cross sectional shape of a wafer paddle, each paddle opening being sized slightly larger than the wafer paddle cross sectional shape, the paddle opening in the first diffuser plate being aligned with the paddle opening of the second diffuser plate, the lower end of first and second diffuser plates thereby being able over and along the wafer paddle by receipt of the wafer paddle through their respective paddle openings, with engagement of the paddle and paddle openings supporting the diffuser plate assembly in an upright position;

a diffuser cup on the first diffuser plate, the diffuser cup being positioned on the first diffuser plate to longitudinally align with the furnace nozzle when an elongated wafer paddle receives the first and second diffuser plates through their respective paddle openings within a semiconductor wafer processing furnace; and the first and second diffuser plates being perforated in an are external of the position of the diffuser cup.

5. The baffle apparatus of claim 4 wherein the perforations form a repetitive pattern in each of the first and second diffuser plates, the pattern of the second diffuser plate being rotationally offset from the pattern of the first diffuser plate.

6. The baffle apparatus of claim 5 wherein the patterns in each of the first and second diffuser plates are repetitive at 90° rotation intervals, the patterns of the first and second diffuser plates being rotationally offset from one another by 45°.

7. The baffle apparatus of claim 4 wherein the diffuser cup includes radial holes.

8. The baffle apparatus of claim 7 wherein the perforations form a repetitive pattern in each of the first and second diffuser plates, the pattern of the second diffuser plate being rotationally offset from the pattern of the first diffuser plate.

9. The baffle apparatus of claim 8 wherein the patterns in each of the first and second diffuser plates are repetitive at 90° rotation intervals, the patterns of the first and second diffuser plates being rotationally offset from one another by 45°.

* * * * *